United States Patent [19]

Senn et al.

[11] Patent Number: 5,394,420
[45] Date of Patent: Feb. 28, 1995

[54] MULTIFORM CRYSTAL AND APPARATUS FOR FABRICATION

[75] Inventors: Robert H. Senn, Anaheim; Loren E. Record, Redondo Beach, both of Calif.

[73] Assignee: TRW Inc., Redondo Beach, Calif.

[21] Appl. No.: 190,347

[22] Filed: Jan. 27, 1994

[51] Int. Cl.[6] .................................................. H01S 3/14
[52] U.S. Cl. ........................................ 372/39; 372/92; 372/34; 372/66
[58] Field of Search ..................... 372/92, 34, 39, 40, 372/68, 41, 66

[56] References Cited

U.S. PATENT DOCUMENTS

| | | |
|---|---|---|
| 3,530,568 | 9/1970 | Owczarski et al. . |
| 3,789,498 | 2/1974 | Cole . |
| 3,836,632 | 9/1974 | Akiyama et al. . |
| 4,033,792 | 7/1977 | Giamei et al. . |
| 4,163,200 | 1/1979 | De Maggio ................. 372/92 |
| 4,256,531 | 3/1981 | Kimura et al. . |
| 4,350,528 | 9/1982 | Engle . |
| 4,475,980 | 10/1984 | Rhemer et al. . |
| 4,507,787 | 3/1985 | Daly et al. ................. 372/66 |
| 4,509,175 | 4/1985 | Daly et al. ................. 372/92 |
| 4,519,870 | 5/1985 | Matsuzawa et al. . |
| 4,900,393 | 2/1990 | Kugimiya et al. . |
| 4,900,394 | 2/1990 | Mankins . |
| 4,910,746 | 3/1990 | Nicholson ................. 372/68 |
| 4,955,036 | 9/1990 | Mozer ....................... 372/68 |
| 4,961,818 | 10/1990 | Benn . |
| 4,984,875 | 1/1991 | Abe et al. . |
| 5,047,370 | 9/1991 | Yamamoto et al. . |
| 5,165,591 | 11/1992 | Pratt . |
| 5,187,714 | 2/1993 | Ozaki et al. ............... 372/34 |
| 5,209,811 | 5/1993 | Kitagawara et al. . |
| 5,219,632 | 6/1993 | Shimakura et al. . |
| 5,321,711 | 6/1994 | Rapoport et al. .......... 372/41 |

OTHER PUBLICATIONS

Coble, R. L., "20. Diffusion Sintering in the Solid State," *Introduction to Ceramics*, John Wiley & Sons (New York), Second Edition, pp. 147-162.

Kingery, et al., "6. Atom Mobility," *Introduction to Ceramics*, John Wiley & Sons (New York), Second Edition, pp. 217-264.

Kuczynski, et al., "21. Sintering Mechanisms of Aluminum Oxide," *Introduction to Ceramics*, John Wiley & Sons (New York), Second Edition, pp. 163-171.

*Primary Examiner*—Léon Scott, Jr.
*Attorney, Agent, or Firm*—Ashok Sanah; S. L. Goldstein

[57] ABSTRACT

A multiform crystal 10 suitable for laser applications is described. The multiform crystal 10 comprises at least two single crystal segments 12 fused together with a joint 14 therebetween, the joint being substantially optically transparent to light propagating through the crystal 10. The multiform crystal 10 is formed by polishing two single crystal segments 12 to form at least one optically flat face on each segment. The polished faces are cleaned and contacted against one another to form a joint 14 between the crystal segments 12. Substantially all the oxygen in the joint 14 is removed. The joint 14 is maintained at a sufficiently high temperature and pressure to join the segments 12 together at the joint forming the substantially optically transparent joint 14. Mounting fixtures suitable for holding the crystal segments 12 firmly against one another in a furnace, without causing undesirable thermal expansive forces to be exerted on the segments 12, are also described. The temperature cycle used to fuse crystal segments can also be used to heat treat laser single crystals to remove substantially all the contaminants and lattice defects in the crystal, providing higher light amplification properties in the crystal.

42 Claims, 3 Drawing Sheets

MULTIFORM CRYSTAL AND APPARATUS FOR FABRICATION

BACKGROUND

This invention relates to a method for joining crystal segments to form a multiform crystal suitable for laser applications.

Large single crystals have advantages compared to small crystals in diverse applications, such as solid state laser and semiconductor applications. For example, large sized laser crystals are useful for generating high intensity laser beams in solid state laser applications, because these crystals provide an elongated resonance pathway for the light propagating through the crystal. In semiconductor applications, large silicon crystals are segmented into single crystal silicon wafers that are useful for efficiently processing large numbers of integrated circuit chips.

Current crystal growing methods, such as the Czochralski technique, can grow single crystals having limited sizes. Furthermore, it is difficult to grow large sized crystals whose quality level is sufficiently high for the crystal to be useful for applications that require high purity crystals, such as solid state lasers. As the cross-sectional area of the crystal increases, there is a greater tendency to form defects through the cross-section. Thus, there is a need for an efficient process for forming large sized single crystals with few crystalline defects.

Furthermore, in the crystal growing process, contaminants, such as halide and metal-containing species, form in the crystal. The halide contaminants typically comprise chlorine and fluorine, and the metal contaminants typically comprise iridium. These contaminants along with the lattice defects in the crystal adversely affect the light amplification properties of the crystal. Thus, there is also a need for a process for removing contaminants and crystalline defects from crystals, including single crystals.

Instead of growing large single crystals, large crystals can be formed by bonding or joining smaller crystal segments to one another. Diverse methods have been developed for joining small single crystal segments to form multi-segment crystals. For example, metallic single crystals useful for turbine engines can be bonded by diffusion bonding methods as disclosed in U.S. Pat. No. 4,033,792 to Giamei et al; and U.S. Pat. No. 4,475,980 to Rhemer et al. Crystals can also be bonded with a bonding agent, such as epoxy or glass frit, in the joint between the crystal segments for adhering the single crystal segments to one another.

However, these crystal joining techniques have limited uses for forming large size crystals for applications requiring a high quality, high purity crystal, where the bond between the crystal segments must be substantially optically transparent or defect free. In solid state laser and opto-electronic applications, defects in the joint between the crystal segments cause attenuation and refraction of the light traversing the crystal. Traditional bonding methods do not provide a high degree of optical transparency in the interface between the joined single crystal segments. For example, when bonding agents are used to join the crystal segments, the resultant non-homogeneous bond between the crystal segments has a refractive index which does not match that of the adjoining crystal segments. The variation in refractive index through the joint causes refraction of the light propagating through the laser crystal. Diffusion bonding methods for joining metallic single crystals are designed to provide a high strength bond, and may not provide an optically transparent bond.

Thus, there is a need for a method for joining single crystal segments to form large multiform crystals having a substantially optically transparent bond. It is also desirable for the bond between the crystal segments be substantially free of defects and imperfections so that the light propagating through the crystal is not refracted or reflected. There is also a need for a process for removing contaminants and lattice defects from single crystals.

SUMMARY

The present invention provides multiform crystals and a method for fabricating the crystals that satisfies these needs. The multiform crystal is suitable for laser applications, and comprises at least two single crystal segments fused together with a joint therebetween, the joint being substantially optically transparent to light propagating through the crystal. The joint is sufficiently transparent that the loss of intensity of the light propagating through the joint, when the joint is transverse to the light path, is less than about 25%, more preferably less than about 5%, and most preferably less than about 1%.

The multiform crystals are particularly useful in a laser device. It is not necessary for use of the multiform crystal in a laser crystal that both segments of the multiform crystal be laser crystals. The multiform crystal can comprise one or more laser crystal segments, and one or more non-laser crystal segments.

A process suitable for joining single crystal segments to form the multiform crystal comprises polishing two single crystal segments to form at least one optically flat face on each of the crystal segments. The optically flat faces of the crystal segments are cleaned and contacted against one another to form a joint between the crystal segments. Substantially all the oxygen in the joint is removed, and the joint is maintained at a sufficiently high pressure and temperature to fuse the crystal segments together at the joint to form the substantially optically transparent joint.

The temperature cycle used to fuse the crystal segments can also be used to remove contaminants and crystalline defects from laser crystals. When the contaminants and crystalline defects are removed, the crystal exhibits higher light amplification properties.

DRAWINGS

These and other features, aspects, and advantages of the present invention will become better understood with reference to the following description, appended claims, and accompanying drawings where:

Figure 4:
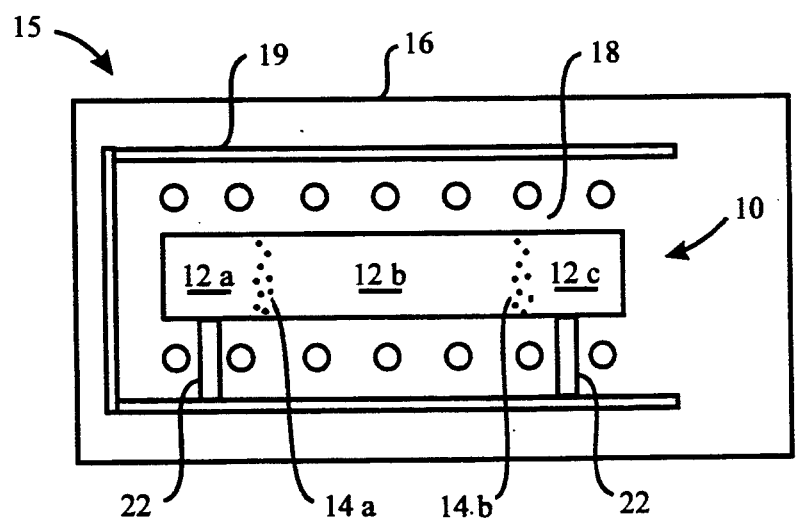
Figure 5:
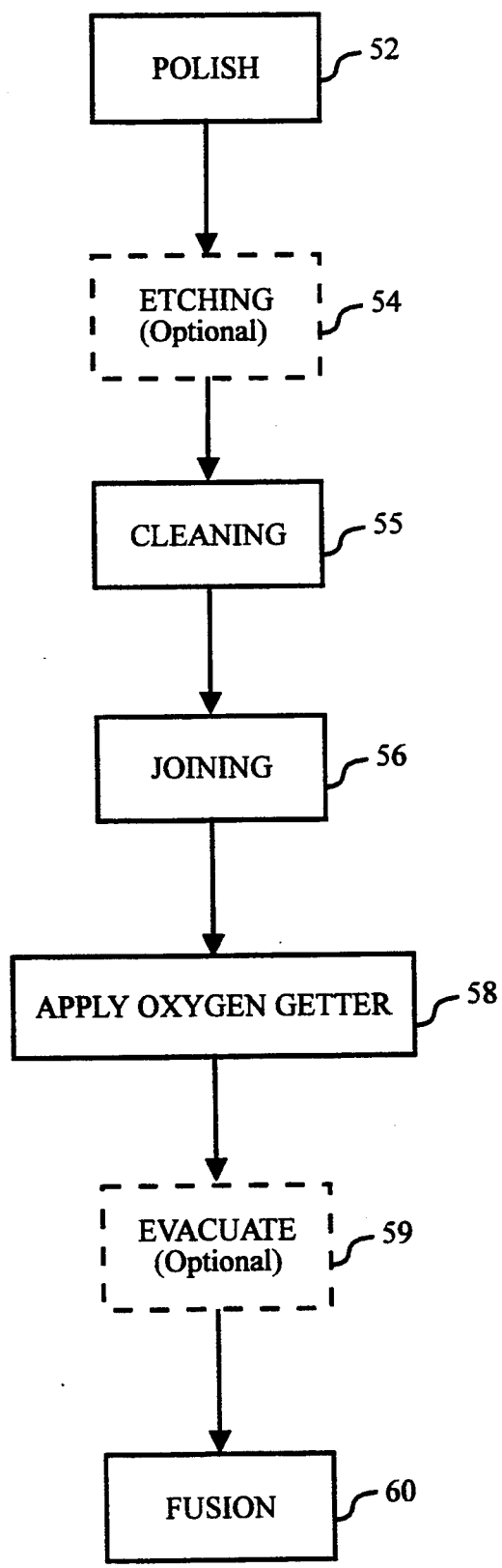
Figure 6:
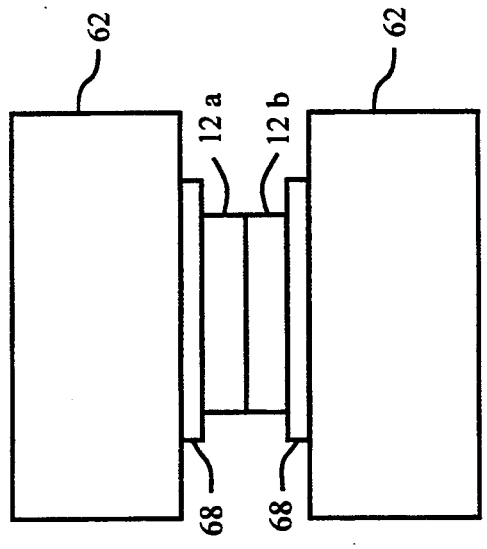
Figure 7:
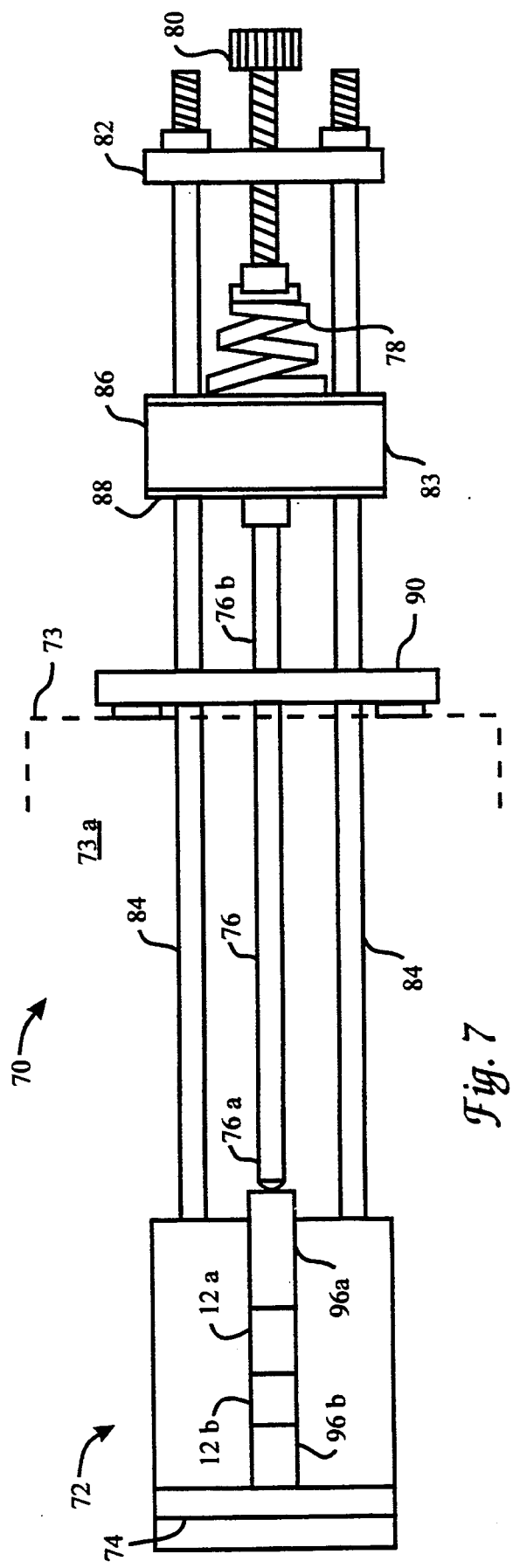

FIG. 4 schematically shows a laser device employing a crystal of the present invention;

FIG. 5 is a process flowchart for forming the multiform crystal of the present invention;

FIG. 6 schematically shows a first mounting fixture useful for manufacturing the multiform crystal of the present invention; and FIG. 7 schematically shows a second mounting fixture useful for manufacturing the multiform crystal of the present invention.

DESCRIPTION

Figure 1:
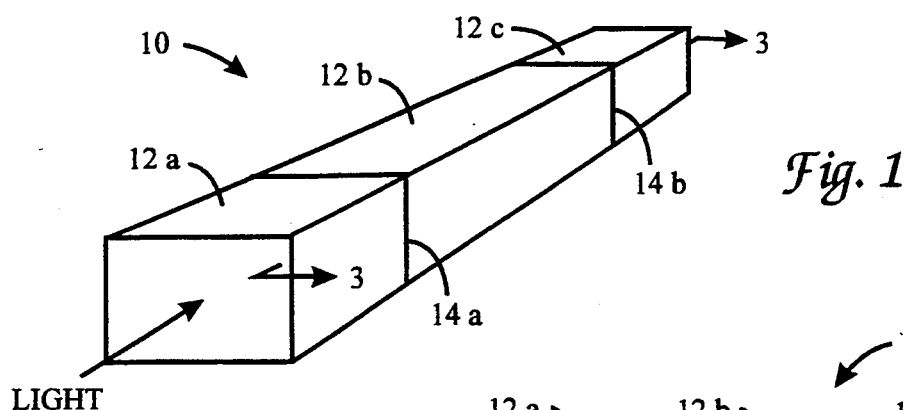
FIG. 1 is a perspective view of three crystal segments joined end to end.

With reference to FIG. 1, a multiform crystal 10 of the present invention comprises three single crystal segments 12a, 12b and 12c, fused together with a joint 14 between segments 12a and 12b, and a joint 14b between segments 12b and 12c. The joint 14a and 14b are substantially optically transparent to light propagating through the crystal 10. The crystal 10 can comprise any types of crystal segments 12, and is particularly useful for optical applications, such as laser applications. Therefore, this application is intended to cover the fabrication of multiform crystals for other applications that require high purity crystals. The laser crystal examples provided herein are provided to illustrate the process of the present invention.

Single crystal segments 12 useful for laser applications, that can be joined to form the multiform crystal 10 of the present invention include "YAG," yttrium aluminum oxide having a garnet structure; yttrium lithium fluoride "YLF"; potassium titanyl phosphate "KTP"; gallium arsenide; indium phosphide; zinc sulfide and zinc selenite. These crystal segments are grown using conventional crystal growing techniques, such as for example those described in R.A. Laudis, "The Growth of Single Crystals," Prentice-Hall, Eaglewood Cliffs, N.J. (1970); U.S. Pat. No. 3,715,194 to Plooster; and U.S. Pat. No. 4,957,713 to Kravetsky, and are commercially available from Union Carbide, Tacoma, Washington, and Lighting Optics, Tarpoon Springs, Fla. To form laser crystals, the crystals are typically doped with a dopant that causes the crystal to amplify light having a particular frequency, or be "tuned" to that frequency. For example, YAG crystals are. typically doped with neodymium, and YLF crystals are typically doped with chromium, tellurium or holmium.

The single crystal segments 12 of the multiform crystal 10 can comprise only laser crystal segments, or can comprise both laser and non-laser crystal segments. When the multiform crystal 10 comprises only laser crystals, the entire crystal is useful as a light resonating crystal. When the multiform crystal 10 comprises undoped "non-laser" crystals, the multiform crystal can be held within a laser device, by-holding the non-laser crystals, to minimize the loss of intensity of the light propagating through the crystal; Preferably, the multiform crystal 10 comprises both laser and non-laser crystal segments.

Figure 2:
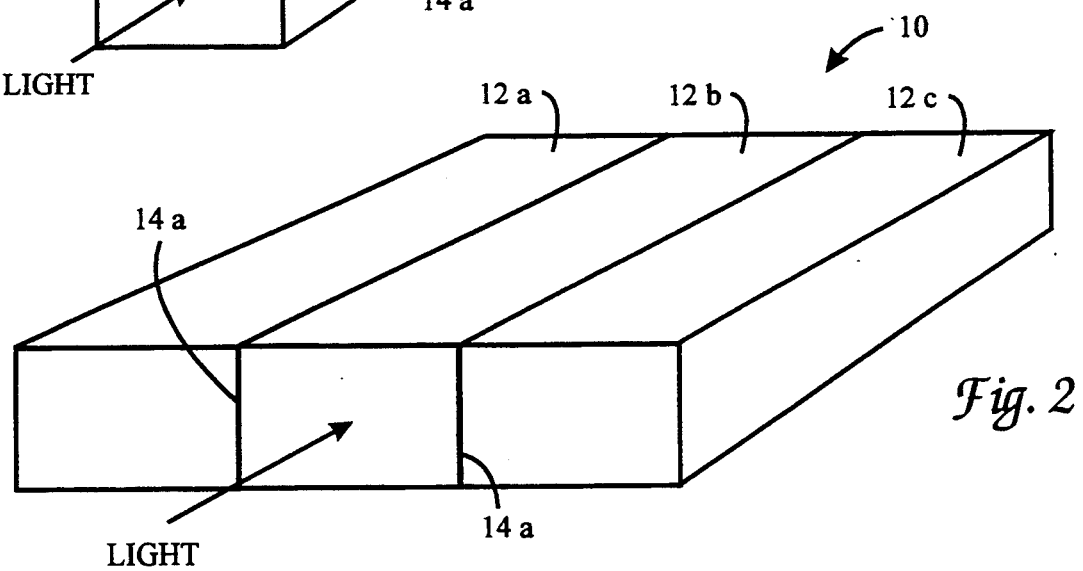
FIG. 2 is a perspective view of three crystal segments joined side to side.
Figure 3:
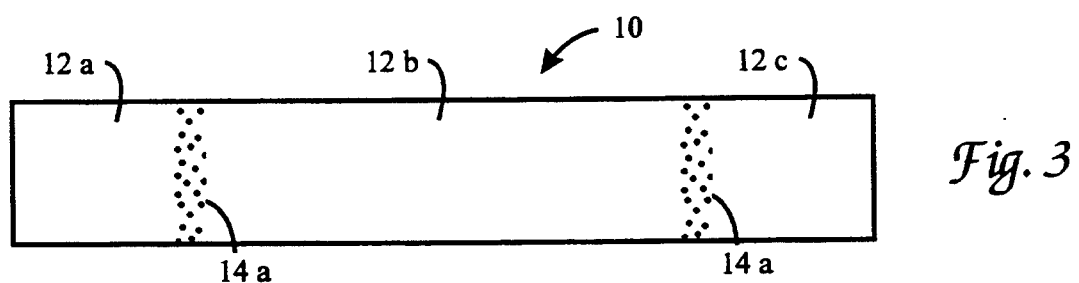
FIG. 3 is a cross-sectional view of the crystal of FIG. 1 taken on line 3—3 in FIG. 1.

The crystal segments 12 can be joined end to end or can be joined at their sides. The joints 14 between the single crystal segments 12 are substantially optically transparent. The joint 14 is either transverse to the path of light propagating through the crystal, as shown in FIGS. 1 and 3, or parallel to the light path, as shown in FIG. 2. When the joint 14 between the single crystal segments 12 is transverse to the path of the propagating light, the loss of intensity of the light propagating through the joint is less than about 5% and preferably is less than about 1%. When the joint 14 between the crystal segments 12 is substantially parallel to the path of the propagating light, the loss of intensity of the light propagating through the joint is negligible and generally has no adverse effect on the light amplification property of the crystal. The loss of intensity of light propagating through the crystal was measured as described below.

With reference to FIG. 4, the multiform crystal 10 can be used in a laser device 15. Typically, the laser device 15 comprises a housing with a light resonating cavity 18 therein. The multiform crystal 10 is mounted in center of the light resonating cavity 18. The cavity 18 is enclosed by a reflecting cylindrical wall 19 with the longitudinal axis of the crystal aligned with the longitudinal axis of the resonating cavity 18. A laser pump, such as a xenon coil lamp 20, suitable for providing light for pumping the multiform crystal 10, is in the housing 16. Typically, the multiform crystal 10 is held in the resonating cavity 18 by the clamps 22. When the multiform crystal 10 comprises both laser and non-laser crystal segments, the clamps 22 are used to hold the multiform crystal by holding the non-laser crystals, to minimize the loss of intensity of the light propagating through the crystal 10. Thus, as shown in FIG. 4, the clamps 22 hold the non-laser segments 12a and 12c.

PROCESS AND MANUFACTURE

Referring now to the flowchart shown in FIG. 5, in general, a process for forming the multiform crystal is shown. In the process, single crystal segments 12 are selected and polished in a polishing stage 52 to form at least one optically flat face on each crystal segment 12. Preferably, each face is polished to have a roughness of less than one-half ($\frac{1}{2}$) the wavelength of the light to be propagated through the crystal segment, and more preferably less than one-fourth ($\frac{1}{4}$) the wavelength. After polishing, the optically flat face of the crystal segments 12 are optionally etched in an etching stage 54 and then cleaned to remove polishing debris and contaminants in a cleaning stage 55. The cleaned and polished faces of the crystal segments are contacted against one another to form a joint 14 therebetween in a joining stage 56. Next, an oxygen gettering material is applied to the joined crystal segments in a stage 58. Then, the joint is maintained at a sufficiently high pressure and temperature to fuse the crystal segments 12 together to form a multiform crystal 10 having a joint 14 that is substantially optically transparent in a fusion stage 60.

The single crystal segments 12 used are generally larger than the desired size of the multiform crystal 10 formed in the process. Larger segments are necessary because during the polishing step, a portion of the crystal segment is polished away. Also, the polished segment faces typically have rounded edges that decrease the actual cross-sectional area of the bond-formed in the multiform crystal. Thus, to obtain a polished crystal segment 12 having a length of about 22 cms and a cross-sectional area of $2 \times 2.5$ cms, typically, the initial crystal segments should have a length of 25.5 cms and a cross-sectional area of $2.5 \times 3$ cms, or about 3.5 cm longer and 5 mm wider than the final crystal dimensions desired.

The details of each process step will now be described.

Polishing

The crystal segments 12 are polished along specific crystal faces so that when the crystal segments 12 are joined to one another, the resultant multiform crystal 10 is suitably orientated for laser applications. The crystalline plane of the crystal segment 12 that is suitable for polishing is identified and marked using conventional X-ray diffractometer techniques, such as those disclosed in B.D. Cullity, Elements of X-Ray Diffraction, Addison-Wessley, N.Y. (1985), which is incorporated herein by this reference. The crystalline planes must be marked with a sufficient degree of accuracy that when the polished faces of the crystal segments 12 are abutted against one another, the difference in parallelity of the adjoining crystal segment faces is-less than about 5° and more preferably less than about 1°.

The crystal segments 12 are polished along the marked faces, using conventional polishing techniques that use sequential polishing steps with successively smaller polishing medium. A suitable vendor for polishing the crystal segments is VECO OPTICS of San Jose, Calif. The segments are polished until optically flat surface is formed. By optically flat it is meant that the surface flatness and flatness are sufficiently low, that when the crystal segments are joined, the joint between the crystal segments is substantially optically transparent. The surface flatness is the vertical distance between the peaks and valleys of the features on the polished face, and is preferably less than about 40 Å, and more preferably less than about 20 Å. The surface flatness is a measure of the end-to-end parallelity of the polished surface and is preferably less than $\lambda/2$, more preferably less than $\lambda/4$, and most preferably less than $\lambda/10$, where $\lambda$ is the "tuned" wavelength of the multiform crystal. For a multiform crystal having a tuned wavelength of 1.06 microns, the surface flatness is preferably less than at least about 0.265 microns, and more preferably less than at least about 0.106 microns.

During polishing, subsurface damage in the crystal segments 12 is minimized because such damage can decrease the transparency of the bond line. After polishing, the crystal segments 12 can be examined using an optical microscope to ensure that the polished crystal faces has no visible scratches, pits or gouges, and that there is no subsurface damage, such as underlying fractures and chips, below the polished faces.

Etching

Optionally, the polished faces of the crystal segments are etched after the polishing step in an etching stage 54. Etching is useful to remove polymeric and metallic contaminants that are adhered to the polished faces of the crystal segments. A suitable etchant comprises a mixture of nitric, chromic, and sulfuric acid in the ratio of about 1:1:1. Another etchant comprises an oxidizing solution, such as a 2% hydrogen peroxide bath, for oxidizing the contaminant particles on the polished crystal face. Preferably, the etching step is carried out by immersing the crystal segment in an ultrasonic bath containing the etchant solution for about 1 to 5 minutes.

Cleaning

In the cleaning stage 55, the polished crystal segments are thoroughly cleaned using multiple rinsing steps. Preferably, the polished segments 12 are cleaned by immersing the polished segments in an ultrasonic bath containing a cleaning solvent, such as acetone, methanol or isopropanol. The ultrasonic cleaning step dislodges polishing media and mounting resin residue adhered to the segment faces. Typically, at least two sequential ultrasonic rinse steps are used, each step effected for about 5 to about 10 minutes.

After the etching and cleaning steps, a lint-free swab soaked in methanol is wiped over the polished crystal segment faces to remove residual dirt or grease. The segment is then examined under reflected light in an optical microscope, and residual lint and dirt removed from the polished crystal face using additional swabs soaked in methanol.

Joining

After cleaning, the polished faces of the crystal segments are abutted against one another in the joining step 56, to form a joint therebetween. Preferably, sufficient pressure is applied to the crystal segments 12 to remove the air in the joint 14. Typically, a pressure from about 1 to about 25 lbs./sq. inch is sufficient to remove substantially all of the air trapped in the joint 14. It is desired to have uniform contact in the joint 14. Such uniform contact occurs when the interface between the polished faces becomes non-reflective.

Apply Oxygen Getter

The oxygen and solvent trapped in the joint 14 between the crystal segments 12 is removed during the fusion stage using an oxygen gettering material, such as a foil of titanium, niobium, molybdenum, columbium, tantalum or cobalt which is wrapped around the crystal segments 12 during the oxygen gettering stage 58. The oxygen gettering foil is first cleaned by immersing the foil in an ultrasonic bath containing a cleaning solvent, such as acetone, methanol or isopropanol, for two sequential ultrasonic rinse steps, each step effected for about 5 to about 10 minutes. After cleaning, the foil of oxygen gettering material is wrapped around the crystal segments 12, and the wrapped crystal segments are placed in an evacuated atmosphere furnace. When the crystal segments 12 are heated, the oxygen and solvent on the polished crystal segment faces react with the oxygen gettering foil. The heating cycle used to heat the crystal segments 12 can be the same heating cycle as the fusion cycle described below, or can be a separate heating cycle. For YAG crystals, a suitable heating cycle comprises maintaining the crystal at a temperature of about 500° C. for about four hours, in a chamber maintained at pressure of about $10^{-6}$ Torr.

Fusion

The abutted polished crystal segments 12 are then mounted in a mounting fixture (described below) that presses the crystal segments firmly against one another during the fusing stage 60. Two alternative mounting fixtures were designed to hold and press the polished faces of the crystal segments against one another. The type of mounting fixture used depended on the size of the crystal segments 12 that were being joined to one another and the atmosphere in which fusion occurs.

The crystal can be mounted in the mounting fixture with a release element between the crystal and the compression element of the mounting fixture, to prevent the crystal segments from fusing to the mounting fixture. The release element is capable of withstanding high temperatures without vaporizing, melting or reacting with the crystal segments. Suitable release agents include oxides, nitrides and carbides, such as zirconium oxide, boron nitride, silicon nitride and tungsten carbide. When the crystal segment is heated in a oxidizing atmosphere, such as an atmosphere containing oxygen or air, a suitable release agent is zirconium oxide or thorium oxide, such as for example $ZrO_2$ felt or cloth, commercially available from Zircar Products, Florida, N.Y. When the crystal segment is heated in a reducing atmosphere, such as an atmosphere containing nitrogen or an inert gas, a suitable release agent is boron nitride.

To fuse the crystal segments 12, a mounting fixture with the crystal segments mounted therein, is positioned in an atmosphere furnace capable of heating the crystal segments in a controlled gaseous atmosphere. A suitable atmosphere furnace is a "LINDBERG MODEL 54454" programmable temperature controlled furnace commercially available from Lindberg Company, Watertown, Wis., or a "VACUUM INDUSTRIES MODEL 40" commercially available from Vacuum Industries, Somerville, Mass. The atmosphere furnace is then heated to a temperature sufficiently high to fuse the crystal segments 12 at the joint 14 between the crystal segments. The heating rate used to heat the crystal segments 12 to the fusion temperature is sufficiently low to preclude the crystal segments from cracking because of the thermal shock caused by rapid increases in temperature. The heating rate depends also on the size of the crystal segments, larger crystal segments requiring lower heating rates and smaller crystal segments capable of withstanding higher heating rates. Typically, the heating rate ranges from about 50 to 150° C./hour. Thus, crystal segments having a length of 9 inches and a diameter of about 1 inch, are heated at a heating rate of from about 50° to 75° C./hr, while crystals having a dimensions smaller than about 3 cms can be heated at heating rates of up to about 150° C./hour.

The fusion temperature depends upon the ion mobility of the crystal. Crystals having a low ion mobility requiring a high fusion temperature, and vice versa. The upper limit of the fusion temperature is the lower of (i) the crystal melting temperature, and (ii) the melting temperature of the furnace and fixture components. By experimentation, it was determined that a suitable temperature for fusing yttrium aluminum oxide crystal segments is from about 1200° C. to about 1700° C., and more preferably is about 1650° C. By experimentation it was also determined that a suitable temperature for fusing yttrium lithium fluoride crystal segments is from about 300° C. to about 1000° C., and more preferably is about 725° C. It is believed that suitable fusion temperatures for potassium titanyl phosphate crystals are from about 500° C. to about 1000° C.; for gallium arsenide crystals are from about 500° C. to about 1240° C.; for indium phosphide crystals are from about 500° C. to about 1070° C.; for zinc sulfide crystals are from about 500° C. to about 1000° C.; and for zinc selenide crystals are from about 700° C. to about 1200° C.

Preferably, the atmosphere furnace is evacuated in an evacuation step 59, before the crystal segments 12 are heated. When the crystal segments 12 comprise an oxide material, evacuation of the furnace causes the oxygen within the segments to disassociate from the metal ions at the fusion temperatures, thereby creating free metal ions in the crystal. The free metal ions can diffuse more rapidly across the joint faces, thereby causing the crystal segments to fuse at a faster rate. Also, evacuating the furnace to a low pressure enhances the oxygen gettering capability of the gettering foil. Thus, preferably, the furnace is evacuated to a pressure of at least about 1 Torr, and more preferably, at least about $10^{-6}$ Torr. When the furnace is evacuated, typically the crystal segments are maintained at the fusion temperature for a period ranging from about 10 to 50 hours, and more typically for about 15 to 40 hours.

When the crystal segments comprise an oxide, such as yttrium aluminum oxide, after fusion, the fused multiform crystal is heated in an oxygen atmosphere using the same heat treatment cycle as that used to fuse the crystal segments. The oxygen heat treatment step is necessary to oxidize these portions of the crystal segments that were reduced or oxygen depleted in the vacuum evacuation and fusion stage. When the crystal segments comprise a non-oxide material, such as yttrium lithium fluoride, the oxygen heat treatment step is not necessary.

Optionally, instead of evacuating the furnace during the fusion process, an oxidizing or reducing atmosphere can be maintained during fusion. An oxidizing atmosphere is used when the crystal segments comprise an oxide, such as YAG crystals. A reducing atmosphere is used for non-oxide crystal materials, such as yttrium lithium fluoride, potassium titanyl phosphate, gallium arsenide, indium phosphide, zinc sulfide and zinc selenite crystals. An oxidizing atmosphere can be maintained in the furnace, by introducing oxygen into the furnace, and a reducing atmosphere can be maintained in the furnace by introducing an inert gas, such as nitrogen or argon, into the furnace. When an oxidizing or reducing atmosphere is maintained in the furnace, typically the fusion temperature is maintained for about 10 to about 160 hours, and more typically for about 135 hours.

After the fusion process, the multiform crystal 10 is then polished to form a configuration suitable for use in solid state laser applications. Conventional laser crystal configurations and polishing procedures are used in this step.

Heat Treatment

The temperature cycle used to fuse the crystal segments can also be used to heat treat laser single crystals. The heat treatment reduces the levels of contaminants, such as halide and metal-containing species, that are present in freshly grown laser crystals. Heat treatment can also reduce the amount of lattice defects, such as dislocation planes, in the crystal. Removal of the contaminants and lattice defects from the crystal increases the light amplification properties of the crystal.

In the heat treatment process, a crystal having contaminants and lattice defects therein, is placed in a furnace. A release agent, such as $ZrO_2$ powder, is placed between the crystal and the furnace to prevent the crystal from adhering to the furnace during the process. The crystal is then heated to a sufficiently high temperature for a sufficient time to cause the contaminants in the crystal to diffuse to the surface of the crystal and vaporize, and to anneal the lattice defects in the crystal. The temperature cycles suitable for fusing the crystal, as previously described, are also suitable for heat treating the crystal. Thus, for example, YAG crystals can be heat treated by heating the crystal to a temperature ranging from 1200° C. to 1700° C., and more preferably 1650° C., for about 80 hours. Similarly, other laser crystals can be heat treated using the fusion temperature cycles previously described. The heat treatment process can be effected in air, or an oxygen containing atmosphere, or in a vacuum of at least about 1 Torr, and more preferably at least about $10^{-6}$ Torr. When the crystal comprises an oxide and a vacuum heat treatment is used, the crystal is partially oxygen depleted after heat treatment. Oxygen is reintroduced in the crystal by heat treating the crystal in an oxygen containing atmosphere, using the same temperature cycle as that used to heat treat the crystal.

Fixture

A fixture 61 suitable for use in the present invention is shown in FIG. 6. The fixture can be used for holding large sized single crystal segments 12a and 12c, sized about 11 inches in length and 2×2 inches in cross-sectional area, against one another. This fixture 61 comprised blocks 62 of alumina capable of withstanding high temperatures. The blocks 62 should have sufficient weight to apply a load ranging from about 100 to 10,000 gm, and more preferably about 4400 gm against the crystal segments 12. Alumina rods (not shown) through the blocks can be provided for holding the fixture together. Release agent 68 can be used to keep the blocks 62 from sticking to the crystal segments 12.

A second fixture 70 suitable for use in the present invention is for holding small crystal segments firmly against one another. These segments typically have sizes ranging from about 0.5 cm to about 15 cm. The mounting fixture 70 comprises a jig 72 within a furnace wall 73 for holding two crystal segments 12a and 12b together in face-to-face relationship. The jig 72 comprising a support 74 and a compression element, such as an elongated rod 76. The rod 76 has a compression end 76a and a distal end 76b for providing a compression force for pressing the crystal segments 12 together against the support 74. A controller such as compression spring 78 is provided for adjustably controlling the amount the compression rod 76 presses the crystal segments 12 together.

A compensator is provided for automatically compensating for the thermal expansion of the compression element that occurs when the mounting fixture is placed in the furnace. The compensator comprises a tension element, such as a pair of tension rods 84, secured to the support 74. The tension rods 84 have a coefficient of thermal expansion about equal to the coefficient of thermal expansion of-the compression rod 76. This is achieved by making all of the rods 76 and 84 of the same material. When the mounting fixture is placed in the furnace 73a and the compression and tension rods are heated by the furnace 73a, the expansion of the tension rods 84 moves the support 74 about the same distance as the thermal expansion of the compression rod 70 moves the crystal segments 12. Thus, the compensator substantially completely prevents the thermal expansion of the compression rod 76 from increasing the compression force on the crystal segments 12.

The amount of force exerted by the spring 78 is controlled with a thumb screw 80 threaded through an end plate 82 into contact with the spring 78, which presses against a compression block 83 mounted against the distal end 76b of the compression rod 76.

Preferably, the compression block 83 comprises an insulative reflector comprising a heat insulative material 86 and a shield 88 capable of reflecting heat away from the controller. A mounting bracket 90 is provided for mounting the fixture 70 against the furnace wall 73. A first release element 96a is provided between the compression rod 76 and one of the crystal segments 12b, and a second release element 96b between one of the crystal segments 12a and the support 74.

Light Attenuation and Energy Extraction Coefficient Measurements

The attenuation, or loss of intensity of light propagating through the multiform crystal, can be measured using conventional techniques. The method used comprised directing a light beam, having a wavelength suitable for exciting the crystal into the multiform crystal, and measuring the loss of intensity of the beam through the crystal. The light beam was generated using a light source, such as a diode pumped Nd:YAG laser. The diameter of the light beam was adjusted to provide a beam having a cross-sectional area approximately twice the cross-sectional area of the crystal. A continuous wave light beam or a pulsed wave light beam was used. When a continuous wave light beam was used, a power meter was used to measure the intensity of the light beam incident on the crystal, and the intensity of the beam existing from the crystal, in Watts. When a pulsed wave light beam was used, an energy meter was used to measure the intensity of the beam incident on, and emanating from, the crystal, in Joules. A suitable power meter is a "MODEL NO. PM 5200" meter commercially available from Molectron, Cantobello, Calif. Suitable meters are also commercially available from Laser Precision, Utica, N.Y., and from Scientech, Boulder, Colo. The loss of intensity of the light beam directed through the crystal was calculated as the ratio of the intensity of the incident light beam to the intensity of the light beam exiting from the crystal.

The energy extraction coefficient of the multiform crystal was measured using a two-stage procedure. Power or energy meters, as described above, were used to make all the light intensity measurements. In the first stage of the procedure, a weak light beam, having an energy about 0.001 Joules, was directed into the multiform crystal, and the energy of the light beam existing from the crystal was measured. The small signal gain in the crystal was calculated using the formula:

$$g_o L = \ln\left(\frac{I_{IN}}{I_{OUT}}\right),$$

where:
  $g_o$ = gain/cm crystal length
  L = length of crystal
  $I_{IN}$ = intensity of light beam directed into crystal
  $I_{OUT}$ = intensity of light beam emanating from crystal The energy stored in the crystal was estimated from the experimentally measured signal gain, using the formula:

$$E_S = \frac{g_o L A h \nu}{\sigma}$$

where:
  $E_S$ = energy stored in crystal
  L = length of crystal
  A = cross-sectional area of crystal
  h = Heisenberg uncertainty constant
  $\nu$ = frequency of light beam directed through crystal
  $\sigma$ = emission cross-section of the lasing transmission for the crystal In the second stage of the procedure, a strong light beam having an energy of about 1 Joule, was directed through the crystal. $E_{IN}$, the energy of the beam directed into the crystal, and $E_{OUT}$, the energy of the beam emanating from the crystal, was measured as before. The energy extracted from the crystal ($E_X$) was then calculated using the formula: $E_{EX} = E_{OUT} - E_{IN}$. Finally, the energy extraction coefficient ($\eta_{EX}$) of the crystal is determined using the formula: $\eta_{EX} = E_{EX}/E_S$.

EXAMPLES 1 and 2

In these examples, three doped yttrium aluminum oxide (YAG) crystal segments, each segment having a length of 22 cm and a cross-sectional area of about 2×2.5 cm, were bonded to one another.

The crystal segments 12 were polished along their lengths, parallel to the direction of growth of the crystals (corresponding to the a-plane of the crystals) so that the segments 12 could be bonded along their lengths to form a multiform crystal be having a wide cross-section, as shown in FIG. 2. Polishing was effected using successive polishing steps using progressively finer polishing media, until the surface flatness of the polished crystals ranged from about $\lambda/4$ to about $\lambda/10$, and the surface flatness of the crystals ranged from about 20 to 40 Å peak to valley. For neodymium doped YAG crystals, $\lambda = 1.064$ μm. After polishing, the polished faces of the crystal segments 12 were examined in an optical microscope to ensure that the polishing faces did not have any scratches, pits or gouges.

The polished segments 12 were etched in a 10% nitric acid solution. After etching, the segments were cleaned by immersing the segments into an ultrasonic bath containing acetone for about 0.5 to 1 minute; followed by immersion in an ultrasonic bath containing methanol for another 0.5 to 1 minute. A lint-free swab was then soaked in methanol and wiped over the crystal segment faces.

After cleaning, the polished faces of the crystal segments 12 were contacted against one another. No oxygen gettering step was effected for Example 1. For Example 2, the crystal segment assembly was wrapped in a clean oxygen gettering niobium foil. The wrapped crystals were heated in a vacuum furnace to a temperature of 500° C., and maintained at that temperature for four hours, to remove the oxygen and solvent on the segments.

After the oxygen removing step, the crystal segments, without the gettering foil, were mounted in the mounting fixture 61 of FIG. 6, which was then positioned in a furnace. Additional alumina blocks (not shown) were placed on either side of the mounting fixture 61 to stabilize and prevent movement of the mounting fixture 61. $ZrO_2$ grains and a "$ZrO_2$" spray was used as a release agent between the crystal segments 12 and the blocks 62 of the mounting fixture 61.

In Example 1, an air atmosphere was maintained in the furnace. The furnace was heated at a rate of about 100° C./hr to a temperature of 1650° C., maintained at this temperature for 80 hours, and then cooled to room temperature at a cooling rate of about 100° C./hr.

In Example 2, "VACUUM INDUSTRIES MODEL 40" atmosphere furnace was used. The furnace was evacuated to a pressure of $10^{-7}$ Torr. The furnace was then heated at a rate of about 50° C./hr to a temperature of 1650° C., maintained at this temperature for 80 hours, and then cooled to room temperature at a cooling rate of about 50° C./hr. The crystal was then heated at a rate of 50° C./hr to a temperature of 1650° C. in an air atmosphere furnace to oxidize the crystal.

After cooling, the multiform crystal 10 formed was examined in an optical microscope. The multiform crystal formed in Example 1, exhibited a small fracture through one of the crystal segments. The multiform crystal formed in Example 2, exhibited small fractures in the top and bottom crystals. It is believed that these fractures occurred because the mounting fixture 61 applied a non-uniform load on the segments. In both examples, the bond between the crystal segments was of excellent quality with no fractures and no visible bubbles, voids or haze.

The increase in the energy extraction coefficient of the multiform crystal, attributable to the heat treatment effected by the fusion process, was estimated as follows. First, the energy extraction coefficient of the heat treated multiform crystal of Example 1, was experimentally measured using the procedure previously described. The experimentally determined energy extraction coefficient of the multiform crystal was determined to be 62%. Then, the energy extraction coefficient of the crystal in its non-heat treated state was estimated using conventional estimation techniques, to be about 43%. The increase of 20% in the energy extraction coefficient is attributable to the heat treatment cycle used to fuse the crystal segments. It is believed that the heat treatment cycle reduced the level of contaminants in the crystal by causing the contaminants to vaporize, and reduced the defects in the crystal by annealing the defects. Thus, the heat treatment fusion cycle is also useful for increasing the energy extraction coefficient of any crystals.

EXAMPLES 3 to 10

In these examples, two or three doped and undoped YLiF crystal segments were bonded to one another at their cross-sections. At least one of the segments had a length of 13.1 cm, and the other segments had a length of 1.5 cm. All the segments had a cross-sectional size of about 11 mm×6.5 mm.

The YLiF crystal segments were examined and the crystallographic plane perpendicular to the direction of growth of the crystals (corresponding to the c-plane) was marked for polishing. The crystal segments 12 were then polished along the marked plane, so that the surface flatness of the polished face ranged from about $\lambda/10$ to $\lambda/4$, and the surface flatness of the crystals ranged from about 20 to 40 Å peak to valley. For homium doped YLiF crystals, $\lambda = 2.067$ um and neoclymium doped YLiF crystals, $\lambda = 1,047$ um. The crystals were examined by optical microscope to ensure that the bonding faces had no scratches, pits or gouges, and to ensure that there was no subsurface damage in the crystals.

The polished segments were ultrasonically cleaned by immersing the segments in an ultrasonic acetone bath for about 10 minutes, followed by immersion in an ultrasonic isopropyl alcohol bath for about 10 minutes. A lint-free swab soaked in methanol was wiped over the polished crystal segment faces to remove residual dirt or grease. The cleaned segments were placed in a clamp tweezer and examined under reflected light in an optical microscope. Lint and dirt on the cleaned segment face was removed using fine tweezers.

After cleaning, the polished faces of the YLiF crystal segments 12 were contacted together and the crystal assembly positioned in the jig 72 of the mounting apparatus 70 shown in FIG. 7. A titanium oxygen gettering foil was cleaned, sprayed with a boron nitride release agent to keep the foil from bonding with the crystal segments, and wrapped around the contacted crystal segments. The screw 80 of the mounting fixture 70 was then adjusted to apply a pressure on the crystal segments to hold the segments 12 against one another. It is estimated that the pressure applied by the mounting fixture 70 on the crystal segments ranged from about 1 to about 25 lbs./sq. inch.

The mounting fixture 70 with the crystal segments 12 mounted-therein, was positioned in the hot zone of an atmosphere furnace 73a. The furnace was a "LIND-BERG MODEL 54454" programmable temperature controlled furnace. The furnace was purged using a flow of $N_2$ at a pressure of about 10 psi for about 2 to 10 minutes. The furnace was then heated in one of the programmed temperature cycles as shown in Table I. During the fusion process, nitrogen was flowed into the furnace at a flow rate of ranging from 100 to 200 sccm, and at a pressure ranging from 10 to 40 psi.

a 1 hour deionized water rinse in a bubbler. The polished crystal segments were ultrasonically cleaned by immersing the segments in a clean beaker containing acetone for about 30 minutes, and then immersing the segments in a beaker containing high purity isopropyl alcohol for 30 minutes. After rinsing, the segments were swabbed with a lint-free swab soaked in high purity methanol.

After cleaning, a BN release agent spray was sprayed on the trough, and on the portions of the mounting fixture 70 of FIG. 7, that were to contact the crystal segments. The polished faces of the crystal segments 12 were contacted and the crystals positioned in the jig 74

TABLE I

| EXAMPLE NO. | YLiF CRYSTAL SEGMENTS BONDED TO ONE ANOTHER | | | INITIAL TEMPERATURE (°C.) | FUSION TEMPERATURE (°C.) (HR) | | DISCOLORATION OXIDATION | DEBONDING | RESULT |
|---|---|---|---|---|---|---|---|---|---|
| 3 | undoped | undoped | | 25 | 650 | 6 | | | |
| 4 | doped | undoped | | 47 | 650 | 14 | | | |
| 5[1] | doped | undoped | | 25 | 700 | 14 | very little | no | Undoped crystal was cracked and Ti foil melted onto the crystal |
| 6 | doped | undoped | | 25 | 650 | 40 | none | yes | One corner of crystal became unbonded, and the one long edge was cracked and eroded |
| 7 | doped | doped | | 25 | 700 | 14 | none | yes | One bond was good, but the other was only 50% bonded with white crystalline growths |
| 8 | undoped | doped | undoped | 25 | 700 | 14 | none | yes | partial bond |
| 9[2] | undoped | undoped | undoped | 25 | 725 | 14 | none | no | good bond |
| 10 | undoped | undoped | undoped | 25 | 725[3] | 20 | none | no | good bond |

NOTES:
[1]For this example, the Ti foil was not coated with BN.
[2]BN was also sprayed on the portions of the top and bottom plungers that contacted the crystal segments.
[3]Heating rate of 2° C./min.
[4]Cool down rate of 2.2° C./min.

EXAMPLES 11 to 13

In these examples, large YLiF crystal segments were bonded to smaller YLiF crystal segments. The large crystal segments had a length of 5.14 inches, and a cross-section of 0.44×0.27 inches. The small crystal segments had a length of 0.59 inches, and a cross-section of 0.44×0.25 inches.

In these examples, a metal trough (not shown) was used to hold the assembled crystal segments 12 against one another, and a niobium foil was wrapped around the crystal segments 12 for oxygen gettering.

The following cleaning procedures were used to clean the trough, the niobium oxygen gettering foil, the beakers used for cleaning the crystal segments, and the crystal segments. The trough was cleaned by immersing in a degreasing solvent for about 15 minutes and then wiping the trough with a swab soaked in high purity isopropyl alcohol. The niobium foil was immersed in an ultrasonic acetone bath for 20 minutes, and then immersed in an ultrasonic high purity isopropyl alcohol bath for 20 minutes. The beakers used for cleaning the crystal segments were first cleaned using a 15 minute chromic sulfate etch; a 30 minute deionized water rinse in a bubbler; a 30 minute ultrasonic detergent wash; and of the mounting fixture 70. The trough was positioned around the crystal segments 12 and the niobium foil was wrapped around the trough to serve as an oxygen gettering shield. The compression screw 80 of the mounting apparatus 70 was adjusted until the spring was compressed to a height ranging from about 0.20 to 0.33 inches, to provide an estimated force of about 20 pounds on the crystal segments 12.

The mounting apparatus 70 with the crystal segments 12 mounted therein, was centered in the hot zone of an atmosphere furnace 73a, and the furnace purged of air using a flow of $N_2$ at a pressure of about 40 psi. The furnace was then heated using the temperature cycle shown in Table II to fuse the crystal segments to one another. During the fusion process, the flow of nitrogen in the furnace was maintained at 100 sccm and at a pressure of 40 psi.

Although the present invention has been described in considerable detail with regard to the preferred versions thereof, other versions are possible. For example, the multiform crystal can comprise semiconductor crystal segments, or opto-electronic crystal segments. Therefore, the appended claims should not be limited to the description of the preferred versions contained herein.

TABLE II

| EXAMPLE NO. | YLiF CRYSTAL SEGMENTS BONDED TO ONE ANOTHER | | INITIAL TEMPERATURE (°C.) | FUSION TEMPERATURE (°C.) (HR) | | DISCOLORATION OXIDATION | DEBONDING | RESULT |
|---|---|---|---|---|---|---|---|---|
| 11 | small | large | 25 | 725 | 14 | none | no | good bond |
| 12 | small | large | 25 | 725 | 14 | none | no | good bond |
| 13 | small | large | 25 | 725 | 14 | none | no | Some fracture and chips |

What is claimed is:

1. A process for joining single crystal segments to form a multiform crystal suitable for laser applications, the process comprising the steps of:
    (a) polishing two single crystal segments to form at least one optically flat face on each of the crystal segments, the optically flat face having a roughness of less than ½ the wavelength of the light propagated through the crystal;
    (b) cleaning the optically flat face of the crystal segments;
    (c) contacting the optically flat face of the crystal segments to one another to form a joint between the crystal segments; and
    (d) maintaining the joint at a sufficiently high pressure and temperature to fuse the crystal segments together at the joint to form a joint that is substantially optically transparent.

2. The process of claim 1, wherein the optically flat faces of the crystal segments have a roughness of less than about ¼ the wavelength of light propagated through the crystal.

3. The process of claim 2, wherein the optically flat faces of the crystal segments have a roughness of less than about 1/10 the wavelength of light propagated through the crystal.

4. The process of claim 1, wherein the step of cleaning the optically flat faces of the crystal segments comprises cleaning the faces using at least one etchant selected from the group consisting of hydrogen peroxide, nitric acid, hydrochloric acid, sulfuric acid, and mixtures thereof.

5. The process of claim 1, wherein the step of contacting the optically flat faces of the single crystal segments comprises maintaining a pressure of at least about 100 gm/sq.cm. on the crystal segments.

6. The process of claim 1, wherein after step (c) substantially all of the oxygen is removed from the joint between the crystal segments by the steps of:
    (a) enclosing the joint with an oxygen getter material;
    (b) evacuating the joint; and
    (c) heating the joint to a temperature sufficiently high to cause oxygen containing species in the joint to vaporize and bond to the oxygen getter material.

7. The process of claim 6, wherein the oxygen getter material comprises a foil made of a material selected from the group consisting of titanium, niobium, tantalum, columbium, cobalt, and mixtures thereof.

8. The process of claim 1, wherein the single crystal segments comprise at least one laser crystal segment and at least one non-laser crystal segment.

9. The process of claim 1, wherein at least one crystal segment comprises yttrium aluminum oxide, and wherein, step (d) comprises maintaining the crystal segments at a temperature of least about 1200° C.

10. The process of claim 1, wherein at least one crystal segment comprises yttrium lithium fluoride, and wherein, step (d) comprises maintaining the crystal segments at a temperature of at least about 300° C.

11. The process of claim 1, wherein at least one crystal segment comprises potassium titanyl phosphate and wherein, step (d) comprises maintaining the crystal segments at a temperature of least about 500° C.

12. The process of claim 1, wherein at least one crystal segment comprises gallium arsenide, and wherein, step (d) comprises maintaining the crystal segments at a temperature of at least about 500° C.

13. The process of claim 1, wherein at least one crystal segment comprises indium phosphide, and wherein, step (d) comprises maintaining the crystal segments at a temperature of least about 500° C.

14. The process of claim 1, wherein at least one crystal segment comprises zinc sulfide, and wherein, step (d) comprises maintaining the crystal segments at a temperature of least about 500° C.

15. The process of claim 1, wherein at least one crystal segment comprises zinc selenide, and wherein, step (d) comprises maintaining the crystal segments at a temperature of least about 700° C.

16. The process of claim 1, wherein in step (d), the crystal segments are heated at a heating rate ranging from about 50° C./hr to 150° C./hr.

17. The process of claim 1, wherein in step (d), the crystal segments are placed in an atmospheric furnace, and the furnace is maintained at a pressure of less than about 1 Torr.

18. The process of claim 17, wherein the furnace is maintained at a pressure of less than about $10^{-6}$ Torr.

19. The process of claim 1, wherein in step (d), the crystal segments are mounted in a mounting fixture capable of exerting a pressure on the crystal segments.

20. The process of claim 19, wherein a release agent is placed between the crystal segments and the mounting fixture, the release agent being substantially chemically inert to the crystal segments at the temperature and pressure used to fuse the segments.

21. The process of claim 1, wherein in step (d), the crystal segments are placed in an atmosphere furnace, and a gas substantially chemically inert to the single crystal segments at the temperature and pressure used to fuse the crystal segments, is introduced into the atmosphere furnace.

22. A process for joining single crystal segments to form a multiform laser crystal comprising the steps of:
    (a) polishing two single crystal segments to form at least one optical flat face on each crystal segment, the optically flat face having a roughness of less than about one-quarter of the wavelength of light propagated through the crystal;
    (b) cleaning the optically flat faces of the crystal segments using at least one liquid selected from the group consisting of hydrogen peroxide, nitric acid, hydrochloride acid, sulfuric acid, acetone, isopropyl alcohol, methanol, and mixtures thereof;

(c) contacting the optically flat faces of the crystal segments to one another to form a joint between the crystal segments;

(d) enclosing the joint with an oxygen getter material, evacuating the joint, and heating the joint to a temperature sufficiently high to cause the oxygen containing species in the joint to vaporize and bond to the oxygen getter material, thereby substantially removing all the oxygen containing species in the joint;

(e) mounting the crystal segments in a mounting fixture with the optically flat faces of the crystal segments abutting one another, the mounting fixture capable of exerting a pressure on the crystal segments; and (f) maintaining the crystal segments at a sufficient high temperature to fuse the crystal segments together at the joint, to form a multiform crystal having a joint that is substantially optically transparent.

23. A process for increasing the energy extraction coefficient of a laser single crystal by removing substantially all the contaminants in the crystal and annealing the lattice defects in the crystal, the process comprising the steps of:

(a) selecting a laser single crystal having contaminants and lattice defects therein, the crystal exhibiting a first lower energy extraction coefficient when light is passed through the crystal; and (b) maintaining the crystal at a sufficiently high temperature for a sufficient time to vaporize substantially all the contaminants in the crystal and to anneal the lattice defects in the crystal, thereby forming a crystal exhibiting a second higher energy extraction coefficient when light is passed through the crystal, the second higher energy coefficient is at least about 20% higher than the first lower energy extraction coefficient.

24. The process of claim 23, wherein the second higher energy extraction coefficient is at least about 30% higher than the first lower energy extraction coefficient.

25. The process of claim 23, wherein the crystal comprises an oxide, and wherein in step (b), the crystal is heated in an atmosphere furnace containing an oxygen containing gas.

26. The process of claim 23, wherein in step (b), the crystal is heated in an atmosphere furnace maintained at a pressure of at least about 1 Torr.

27. The process of claim 26, wherein the atmosphere furnace is maintained at a pressure of at least about $10^{-6}$ Torr.

28. The process of claim 26, wherein the crystal comprises an oxide, and wherein the process further comprises the step of placing the crystal in an atmosphere furnace, maintaining an oxygen containing atmosphere in the furnace, and heating the crystal to a temperature sufficiently high to cause oxygen to react with the crystal.

29. The process of claim 23, wherein the crystal comprises yttrium aluminum oxide, and wherein step (b) comprises maintaining the crystal at a temperature of at least about 1500° C. for at least about 10 hours.

30. The process of claim 23, wherein the crystal comprises yttrium aluminum oxide, and wherein step (b) comprises maintaining the crystal at a temperature of at least about 1650° C. for at least about 10 hours.

31. The process of claim 23, wherein the crystal comprises yttrium lithium fluoride, and wherein step (b) comprises maintaining the crystal at a temperature of at least about 300° C. for at least about 5 hours.

32. The process of claim 23, wherein the crystal comprises potassium titanyl phosphate, and wherein step (b) comprises maintaining the crystal at a temperature of at least about 500° C.

33. The process of claim 23, wherein the crystal comprises gallium arsenide, and wherein step (b) comprises maintaining the crystal at a temperature of at least about 500° C.

34. The process of claim 23, wherein the crystal comprises indium phosphide, and wherein step (b) comprises maintaining the crystal at a temperature of at least about 500° C.

35. The process of claim 23, wherein the crystal comprises zinc sulfide, and wherein step (b) comprises maintaining the crystal at a temperature of at least about 500° C.

36. The process of claim 23, wherein the crystal comprises zinc selenide and wherein step (b) comprises maintaining the crystal at a temperature of at least about 700° C.

37. The process of claim 23, wherein the furnace is heated at heating rate ranging from about 50° C./hr to about 150° C./hr.

38. An apparatus for joining crystal segments comprising:

(a) a jig for holding two crystal segments together in face-to-face relationship in a heating apparatus, the jig comprising a support and a compression element providing a compression force pressing the crystal segments together against the support, wherein the compression element thermally expands in the heating apparatus;

(b) a controller for adjustably controlling the amount the compression element presses the crystal segments together; and (c) a compensator for automatically compensating for the thermal expansion of the compression element.

39. The apparatus of claim 38, wherein the compensator substantially completely prevents thermal expansion of the compression element from increasing the compression force on the crystal segments.

40. The apparatus of claim 38, wherein the compensator comprises a tension element secured to the support, the tension element being heated by the heating apparatus and having a coefficient of thermal expansion about equal to the coefficient of thermal expansion of the compression element so the thermal expansion of the tension element moves the support about the same distance that thermal expansion of the compression element moves the crystal segments.

41. The apparatus of claim 38, wherein the controller comprises a spring pressing on the compression element.

42. The apparatus of claim 38, further comprising an insulative reflector mounted between heating apparatus and the controller, the reflector comprising a heat insulative material that is capable of reflecting heat away from the controller.

* * * * *